United States Patent [19]
Young

[11] Patent Number: 5,605,845
[45] Date of Patent: Feb. 25, 1997

[54] MANUFACTURE OF ELECTRONIC DEVICES COMPRISING THIN-FILM TRANSISTORS HAVING SELF-ALIGNED PLURAL GATES

[75] Inventor: Nigel D. Young, Redhill, England

[73] Assignee: U.S. Philips Corporation, New York, N.Y.

[21] Appl. No.: 359,372

[22] Filed: Dec. 20, 1994

[30] Foreign Application Priority Data

Dec. 20, 1993 [GB] United Kingdom ............... 9325984

[51] Int. Cl.$^6$ ........................................ H01L 21/84
[52] U.S. Cl. ................ 437/21; 437/40; 437/944; 148/DIG. 100; 257/365; 430/319
[58] Field of Search ............... 437/21, 40 GS, 437/40 TFI, 40 TFT, 41 GS, 41 TFI, 41 TFT, 101, 233, 944; 257/57, 66, 365; 430/312, 318, 319; 148/DIG. 100

[56] References Cited

U.S. PATENT DOCUMENTS

| | | | |
|---|---|---|---|
| 5,124,769 | 6/1992 | Tanaka et al. | 257/365 |
| 5,130,829 | 7/1992 | Shannon | 359/59 |
| 5,250,835 | 10/1993 | Izawa | 257/365 |
| 5,338,959 | 8/1994 | Kim et al. | 257/365 |
| 5,446,304 | 8/1995 | Sameshima et al. | 257/365 |

FOREIGN PATENT DOCUMENTS

| | | | |
|---|---|---|---|
| 61-224362 | 10/1986 | Japan . | |
| 63-47981 | 2/1988 | Japan . | |
| 63-119580 | 5/1988 | Japan . | |
| 6-13407 | 1/1994 | Japan | 437/40 TFT |

OTHER PUBLICATIONS

J. Vanfleteren et al., IEEE Electron Dev. Lett., 6(1)(1985) 11, "... Lift-Off Process for the Polycrystalline CdSe TFT" Jan. 1985.

Primary Examiner—Charles L. Bowers, Jr.
Assistant Examiner—Leon Radomsky
Attorney, Agent, or Firm—Norman N. Spain

[57] ABSTRACT

In the manufacture of active-matrix liquid-crystal displays or other large area electronic devices, self-aligned photolithographic process steps (FIGS. 2 and 5) are used to define first and second gates (1 and 2) of a TFT from first and second conductive layers (21 and 22). In the first self-aligned step a positive photoresist (26) is selectively exposed by illumination (31) through the substrate (10) while using opaque areas (3 and 4) of the TFT source and drain as a photomask; after developing this selectively-exposed positive photoresist (26) and depositing the first conductive layer (21), a lift-off process is used to leave a first area (21a and 21b) of the first conductive layer where the first and second gates (1 and 2) are to be provided. Then a part (21b) of this first area is removed to leave a smaller, second area (21a) of the first conductive layer (21) for forming the first gate (21). Thereafter the second self-aligned photolithographic process step is carried out by selectively exposing a second photoresist film (27) by illumination (32) through the substrate (10) while using opaque areas of the source and drain and first gate as a photomask. By developing this selectively-exposed second photoresist (27), a second photoresist area (27a) is formed for defining an area of the second conductive layer (22) which provides the second gate (2). The second photoresist (27) may be of either the positive or negative type. One of the gates (1 and 2) may be used as a field-plate or as a tetrode gate. The use of this sequence of process steps, including the two self-aligned steps, reduces the parasitic capacitances and capacitive couplings in the TFT structure, so permitting fast and stable circuit operation of the TFT in the device.

16 Claims, 3 Drawing Sheets

MANUFACTURE OF ELECTRONIC DEVICES COMPRISING THIN-FILM TRANSISTORS HAVING SELF-ALIGNED PLURAL GATES

This invention relates to methods of manufacturing an electronic device which comprises a thin-film field-effect transistor (hereinafter termed "TFT") on a substrate, the transistor having a gate formed using self-aligned photolithographic process steps. The device may be, for example, an active-matrix liquid-crystal display or other flat panel display, or any other type of large area electronic device with TFTs, for example, a thin-film data store or an image sensor.

BACKGROUND OF THE INVENTION

There is currently much interest in developing thin-film circuits with TFTs on glass and on other inexpensive insulating substrates for large area electronics applications. Such TFTs fabricated with amorphous or polycrystalline semiconductor films may form the switching elements of a cell matrix, for example in a flat panel display as described in U.S. Pat. No. 5,130,829 (our reference PHB33646), the whole contents of which are hereby incorporated herein as reference material. A recent development involves the fabrication and integration of circuits from TFTs (often using polycrystalline silicon) as, for example, integrated drive circuits for such a cell matrix. In order to increase the circuit speed, it is advantageous to avoid an overlap of the TFT gate with its source and drain. Therefore preferably a self-alignment process is used at this stage in the manufacture.

Published Japanese Patent Application Kokai JP-A-63-47981 describes the manufacture of a TFT on a substrate, the transistor having a gate for controlling current flow between source and drain, and the gate being formed using self-aligned photolithographic process steps which include:

(a) selectively exposing a first photoresist film by illumination through the substrate while using opaque areas of the source and drain as a photomask, and (b) developing the selectively-exposed first photoresist film to leave a first photoresist area for defining an area of the gate.

JP-A-63-47981 acknowledges that a lift-off process was known (e.g. as illustrated in FIG. 8 of JP-A-63-47981) using a photoresist of the positive type which is exposed and developed before depositing a conductive layer for the gate. JP-A-63-47981 considers that the lift-off process has a poor yield and teaches avoiding such a lift-off process by forming the gate from a transparent conductive layer with a negative-type photoresist in steps (a) and (b); the transparent conductive film is deposited before providing this negative-type photoresist film for step (a). The photoresist area left on the transparent conductive layer after development is used subsequently as an etchant mask while etching away the conductive layer from over the source and drain; the remaining unetched area of the conductive film forms the gate. The whole contents of JP-A-63-47981 are hereby incorporated herein as reference material.

However the present inventor has found such an approach imposes undesirable restrictions and constraints on the types of gate structure which can be formed using self-aligned photolithographic process steps, and particularly in the case of a TFT having more than one gate.

SUMMARY OF THE INVENTION

It is an aim of the present invention to avoid and/or mitigate the restrictions and constraints.

According to the present invention there is provided a method of manufacturing an electronic device which comprises a thin-film field-effect transistor on a substrate, the transistor having a gate for controlling current flow between source and drain, the gate being formed using self-aligned photolithographic process steps which include:

(a) selectively exposing a first photoresist film by illumination through the substrate while using opaque areas of the source and drain as photomask, and (b) developing the selectively-exposed first photoresist film to leave a first photoresist area for defining an area of the gate, which method is characterised in that the transistor has first and second gates formed from respective first and second conductive layers in separate self-aligned photolithographic process steps, wherein the first photoresist film of steps (a) and (b) is of the positive type and is used in a lift-off process including the steps of:

(c) depositing the first conductive layer of opaque material after developing the first photoresist film in step (b), and (d) then removing the first photoresist area to leave a first area of the first conductive layer where the first and second gates are to be provided, after which a part of the first area of the first conductive layer is removed in a step (e) to leave a smaller, second area of the first conductive layer for forming the first gate, and thereafter the second photoresist film is provided in a step (f), and the second gate is then formed by further self-aligned photolithographic process steps which include:

(g) selectively exposing the second photoresist film by illumination through the substrate while using the opaque areas of the source and drain and first gate as a photomask, and (h) developing the selectively-exposed second photoresist film to leave a second photoresist area for defining an area of the second conductive layer which provides the second gate.

Thus, the present invention permits the self-alignment of both first and second gates with each other and with the source and drain. As a result, the device can be manufactured with fast TFT circuit elements. The method in accordance with present invention uses a positive photoresist in a lift off process (contrary to the teaching in JP-A-63-47981) to define the first gate. By this approach, less restrictions and constraints are placed on fabrication of the second gate. Thus, for example, in one form, the second photoresist film of steps (f), (g) and (h) may be of a negative type provided after the second conductive layer of transparent material, and the second photoresist area may be used as an etchant mask while forming the second gate from this second conductive layer. In another form, the second photoresist film of steps (f), (g) and (h) is of positive type provided before depositing the second conductive layer, and a lift-off process is used to form the second gate from the second conductive layer.

In the process described in JP-A-63-47981, after forming the opaque areas of the source and drain on the substrate and before carrying out steps (a) and (b) for forming the gate, a semiconductor film is deposited to provide a channel region of the transistor between the source and drain; this semiconductive film is transparent to the illumination used to expose the photoresist through the substrate. Such an approach may be used in a method in accordance with the present invention. The channel region may be formed in such a film of amorphous semiconductor material, or the film may be crystallised with a laser beam to form polycrystalline material for the channel region.

However, a method in accordance with the present invention may be further characterised by forming the semiconductor film on the substrate before the opaque areas of the source and drain and before carrying out the steps (a) to (h) for forming the gates, which semiconductor film provides channel regions of the transistor between the source and drain and is transparent (in the channel region) to the illumination in steps (a) and (g). The channel regions may be formed in amorphous semiconductor material. However, this sequence of steps permits a variety of options for forming the semiconductor film of polycrystalline semiconductor material which has a higher mobility than amorphous semiconductor material. The semiconductor film may be deposited as polycrystalline silicon, or it may be deposited as amorphous silicon which is subsequently converted in situ on the substrate into polycrystalline silicon by heating either in a furnace or with a laser beam. The film may even be deposited as an insulating or semi-insulating non-stoichiometric silicon-compound material which is subsequently converted into polycrystalline silicon by annealing with a laser beam as disclosed in published European patent application EP-A-0 561462 (our reference PHB 33784), the whole contents of which are hereby incorporated herein as reference material.

The present invention permits the fabrication of several types of TFT structures. In one form, the TFT may be a tetrode having first and second independently biased gates. In another form, one of the first and second gates may be connected at a potential associated with the TFT so as to form a field-plate in the TFT. Thus, for example, one of the first and second gates may be connected to the drain of the TFT so as to form a field plate. A further form of TFT in accordance with the present invention may be characterised by the source and drain comprising regions of a first conductivity type which are formed on the substrate before depositing the semiconductor film, and by the source and drain also comprising regions of a second, opposite conductivity type which are deposited on semiconductor film. In this case, the TFT may be operated as either an N-channel or a P-channel device, depending on the polarity of the bias voltage applied to the first and second gates.

BRIEF DESCRIPTION OF THE DRAWING FIGURES

These and other features of the present invention, and their advantages, are illustrated specifically in embodiments of the invention now to be described, by way of example, with reference to the accompanying diagrammatic drawings, in which.

Figure 1:
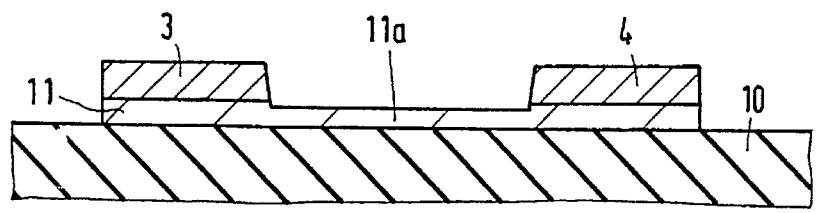
FIGS. 1 to 7 are cross-sectional views of a TFT structure at successive stages in its manufacture by a method in accordance with the present invention.

It should be noted that all the drawings are diagrammatic and not drawn to scale. Relative dimensions and proportions of parts of the Figures have been shown exaggerated or reduced in size for the sake of clarity and convenience in the drawings. The same reference signs are generally used to refer to corresponding or similar features in the different embodiments.

DESCRIPTION OF THE INVENTION

The TFTs manufactured in accordance with these embodiments of FIGS. 1 to 10 form part of a large-area electronic device, for example, a flat panel display as illustrated in U.S. Pat. No. 5,130,829, or a large-area in the image sensor, or a data store. The device has a substrate 10 on which thin-film circuitry is formed, for example, a matrix of TFT switching transistors and TFT drive circuits. In the case of a flat panel display as described in U.S. Pat. No. 5,130,829, the substrate 10 is a back plate of the display. The device substrate 10 is electrically insulating at least adjacent to its top surface. The substrate 10 may comprise a glass or any other low-cost insulating material; and in a particular embodiment, it may comprise an upper layer of silicon dioxide on a glass base. In most typical cases, the substrate 10 is only capable of withstanding temperatures of less than 700° C. (Celsius), for example up to about 625° C. A large number of the individual TFTs are generally formed side by side on the device substrate 10 and are interconnected by thin-film conductor patterns extending on the substrate 10.

Figure 5:
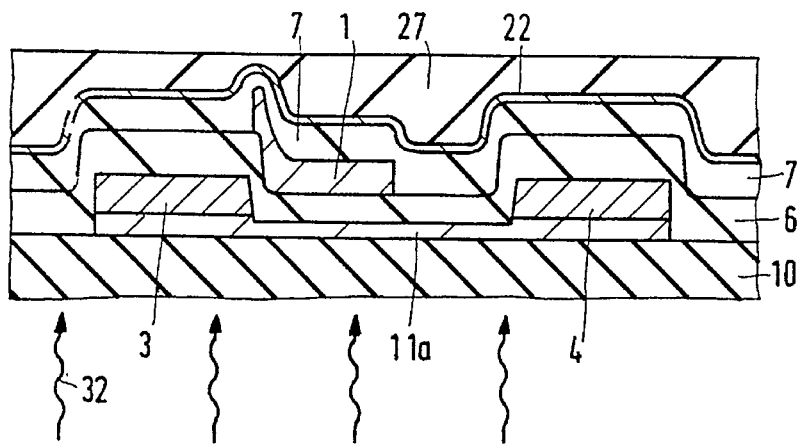
Figure 6:
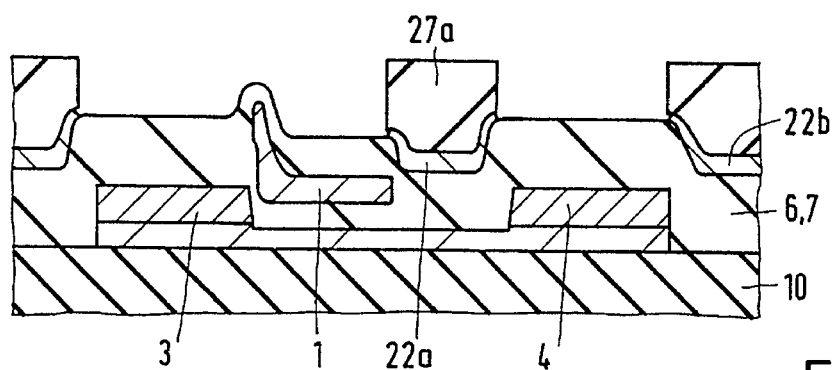
Figure 7:
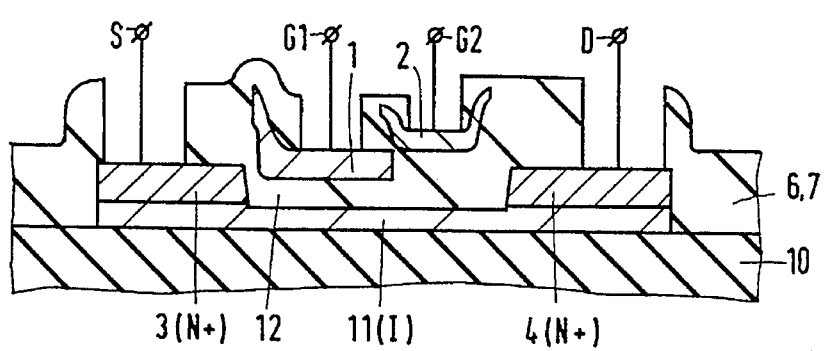
Figure 8:
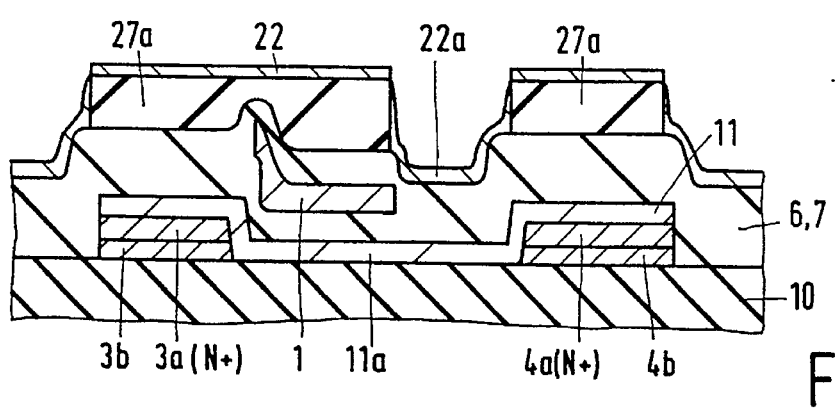
FIGS. 8 and 9 are cross-sectional views of a different TFT structure manufactured by a modified method also in accordance with the present invention.
Figure 9:
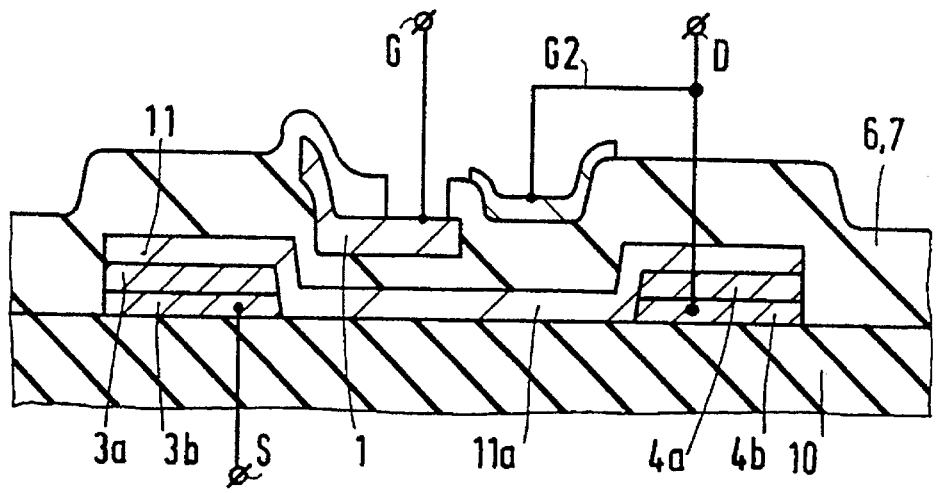
Figure 10:
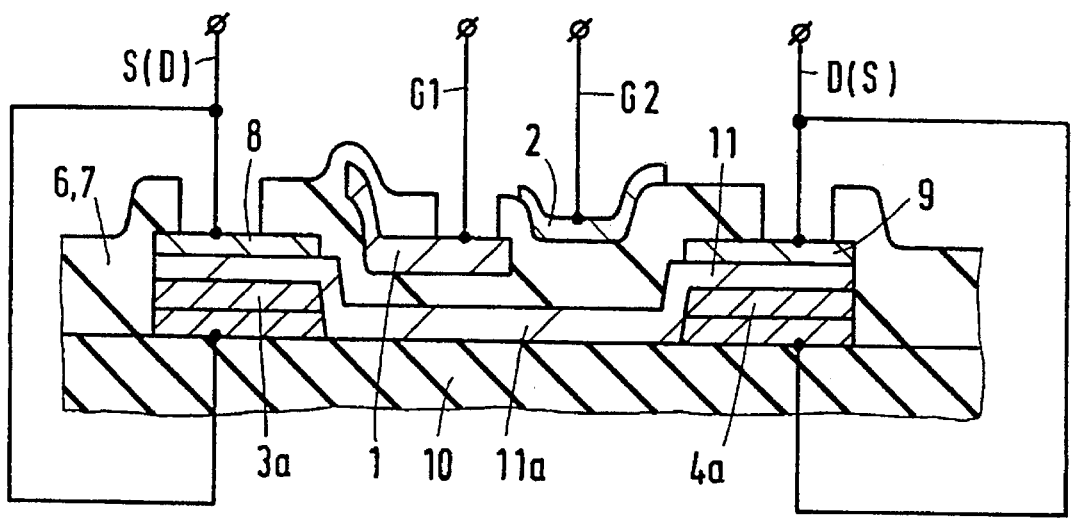
FIG. 10 is a cross-sectional view of yet another TFT structure manufactured by a method in accordance with the present invention.

FIG. 7 illustrates the TFT which results from carrying out the manufacturing method of FIGS. 1 to 7. FIG. 9 illustrates the TFT resulting from modifications of this method, including the FIG. 8 arrangement at one of its stages. FIG. 10 illustrates the TFT resulting from a further modification of the method. These transistors comprise a silicon thin-film body 11 of a semiconductor material (e.g. hydrogenated polycrystalline silicon) which provides a channel region 11 a of the transistor between source 3,S and drain 4,D of the transistor. The channel region 11 a may be of substantially intrinsic conductivity type (I) between highly-doped (N+) source and drain regions 3 and 4 of the TFT. The transistor has a first gate (1,G1) and a second gate (2,G2) which are capacitively coupled to the channel region 11 for controlling current flow between the source 3, S and the drain 4, D. The first and second gates may comprise electrodes 1 and 2 respectively of a metal or of a highly-doped (N+) polycrystalline silicon on a dielectric film 12 (e.g. of silicon dioxide and/or nitride) on the silicon body 11. These first and second gates 1 and 2 are formed from respective first and second conductive layers 21 and 22 in separate self-aligned photolithographic process steps, e.g. see FIGS. 2 and 5.

Figure 2:
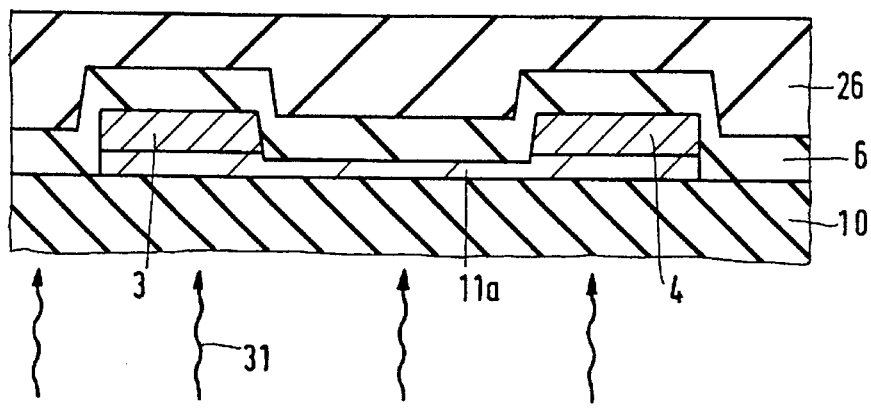
Figure 3:
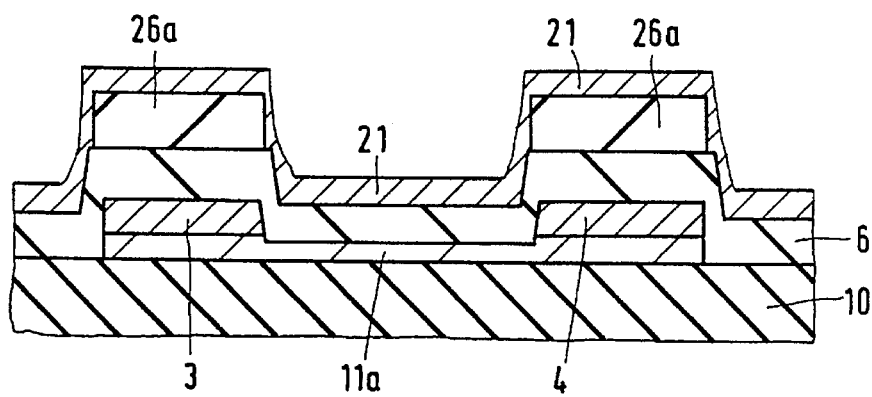
Figure 4:
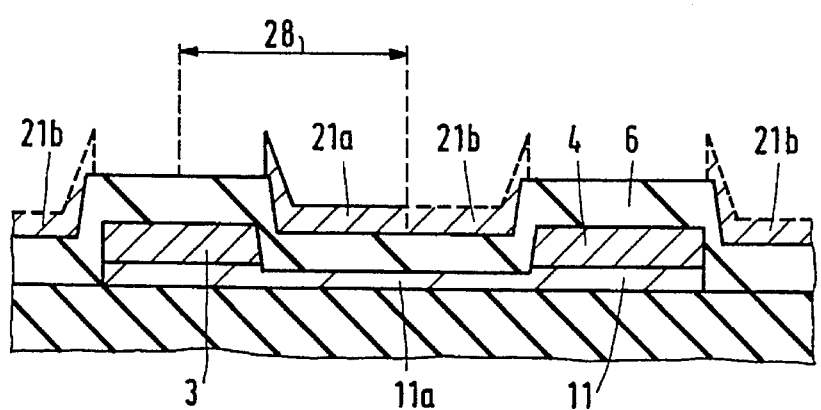

In accordance with the present invention, the methods used to manufacture the electronic device comprising these TFTs include the steps of:

a) Selectively exposing a first photoresist film 26 by illumination 31 through substrate 10 while using opaque areas 3 and 4 of the source and drain as a photomask (e.g. see FIG. 2);

b) Developing the selectively-exposed first photoresist film 26 to leave a first photoresist area 26a for defining an area of the gate 1 (e.g. see FIG. 3);

c) Depositing the first conductive layer 21 of opaque material after developing the first photoresist film 26 (e.g. see FIG. 3);

d) Removing the first photoresist area 26a to leave a first area 21a and 21b of the first conductive layer 21 where the first and second gates 1 and 2 are to be provided (e.g. see FIG. 4);

e) Removing a part 21b of the first area of the first conductive layer 21 to leave a smaller, second area 1

(21a) of the first conductive layer 21 for forming the first gate 1 (e.g. see FIG. 4);

f) Providing a second photoresist film 27 (e.g. see FIG. 5);

g) Selectively exposing the second photoresist film 27 by illumination 32 through substrate 10, while using the opaque areas 3, 4 and 1 of the source and drain and first gate as a photomask, and;

h) Developing the selectively-exposed second photoresist film 27 to leave a second photoresist area 27a (see e.g. FIG. 6 or 8) for defining an area 22a of the second conductive layer 22 which provides the second gate 2 (see FIG. 7 or 9 or 10).

The embodiment of FIGS. 1 to 7 will now be described in more detail.

On the device substrate 10, a semiconductor crystalline film 11 of silicon is deposited for providing the channel regions 11a of the TFTs to be formed on the substrate 10, of which FIG. 7 shows just one TFT. The silicon film may be deposited by a low pressure chemical vapour deposition (LPCVD) process or a plasma-enhanced chemical vapour deposition (PECVD) process. At a deposition temperature of about 620° C. with LPCVD or 350° C. with PECVD, a polycrystalline silicon film is provided in situ of the substrate 10. With a lower temperature (e.g. less than 550° C. with a LPCVD process, or between 200° C. and 300° C. with a PECVD process) amorphous silicon material is deposited. This amorphous silicon material may be crystallised into polycrystalline material in known manner, by heating the structure in a furnace to about 600° C. or by heating the film with a laser beam.

Because the heating step is carried out before providing any of the other regions of the TFT (ie the source 3, drain 4 or gates 1 and 2), there is considerable freedom for optimising the deposition and/or subsequent heating parameters so as to obtain the desired crystalline quality for the silicon film. The resulting polycrystalline silicon film generally has intrinsic type conductivity due to the high density of trapping states within the energy band gap. These trapping states result from the presence of crystal defects at the grain boundaries and within the grains themselves. The thickness of the film may be less than 0.1 micrometers (μm), for example about 60 nanometers (nm) in a specific TFT example.

A silicon electrode film, having a high phosphorous doping, is then deposited in known manner by chemical vapour deposition. This electrode film may be sufficiently thick (for example at least 0.1 μm thick, ie 100 nm) so as to be opaque to the ultraviolet illumination 31 and 32 used in the process steps of FIGS. 2 and 5. However a thinner silicon electrode film may be used with an opaque metal coating. The film structure is then subjected to two photolithographic and etching steps to form the TFT body structure of FIG. 1. In one of these steps, the individual bodies of each TFT are formed by etching both films through their thickness to the substrate 10. In the other step, the electrode film is removed from above the channel region 11a to form the source and drain regions 3 and 4. In both the photolithographic and etching steps, negative or positive photoresist layers may be used to provide the etchant masks on the silicon films. The resulting structure is shown in FIG. 1, after removal of the etchant photomasks.

An insulating layer 6 (for example of silicon dioxide) is then deposited in known manner for providing the gate dielectric. This insulating layer 6 may be for example, 100 to 300 nm thick. The structure is then coated with the positive photoresist film 26, for example to a thickness of 1 μm. The positive photoresist film 26 is selectively exposed by illumination with ultraviolet radiation 31 through the substrate 10 while using the opaque areas 3 and 4 of the source and drains as a photomask. The film region 11a and layer 6 are transparent to the radiation 31. This process step (a) is illustrated in FIG. 2. The selectively exposed film 26 is then developed in known manner, as a result of which photoresist areas 26a are left where the film 26 was masked by the opaque areas 3 and 4.

The first conductive layer 21 (for example of doped amorphous or polycrystalline silicon, or of a metal such as aluminium or chromium) is then deposited. The resulting structure is illustrated in FIG. 3. The thickness of the film 21 may be, for example, about 100 to 200 nm, or less. There is a sufficient weakness or discontinuity of the film 21 adjacent the edges of the photoresist areas 26a for the photoresist areas 26a to lift away the overlying areas of the conductive film when the photoresist areas 26a are removed, for example with a solvent. The remaining areas 21a and 21b of the conductive film 21 are illustrated in FIG. 4.

The process step (e) is now carried out to remove parts 21b which are illustrated in broken outline in FIG. 4. This may be carried out in known manner using a photolithographic and etching process with a negative-type or positive-type photoresist. The photoresist is selectively exposed through a photomask positioned over the top of the FIG. 4 structure. The selectively-exposed photoresist is then developed to leave a photoresist etchant mask over the area 28 in FIG. 4. The structure is then subjected to an etching treatment to remove the portions 21b. The remaining portion 21a forms the first gate 1 of the TFT.

An insulating layer 7 is then provided on at least the first gate 1. This insulating layer 7 separates the gates 1 and 2 of the TFT. When the gate 1 is of a metal such as aluminium or tantalum, the insulating layer 7 may be formed by anodising (or otherwise oxidising at a low temperature) the surface of the gate 1. However, the insulating layer 7 may be formed by depositing a further layer over the structure as illustrated in FIG. 5. The further insulating layer 7 may be of, for example, silicon dioxide.

In the embodiment of FIGS. 1 to 7, the second gate 2 is of a transparent material whose area is defined by a photolithographic and etching technique using a negative photoresist 27. In this case, the second conductive layer 22 is deposited before providing the second photoresist 27. This transparent layer 22 may be of for example, indium tin oxide (ITO).

As illustrated in FIG. 5, the negative photoresist film 27 is selectively exposed by illumination with ultraviolet radiation 32 through the substrate 10. In this illumination step, the opaque areas 3, 4 and 1 of the source, drain and first gate serve as a photomask. The film region 11a and layers 6, 7 and 22 are transparent to this radiation 32. The selectively exposed photoresist film 27 is then developed in known manner. Being photoresist of the negative type, the exposed areas 27a of the film 27 remain after development. These areas 27a now act as an etchant mask when subjecting the conductive layer 22 to an etching treatment to etch away the layer 22 from over the source 3, drain 4 and first gate 1. The resulting structure is illustrated in FIG. 6.

The photoresist areas 27a are then removed to expose the remaining parts 22a and 22b of the conductive film 22. The area 22a between the first gate 1 and the drain 4 provides the second gate 2 of the TFT. The area 22b which was left over the substrate areas between the TFTs is subsequently either completely removed or etched into a desired conductor pattern between the TFTS. Contact windows are now etched in known manner through the insulating layers 6 and 7 to provide connections S, G1, G2 and D for the source 3, first gate 1, second gate 2 and drain 4. These connections may be formed by metal tracks (for example of aluminium) extending over the insulating layers 6 and 7 and the substrate 10. The resulting structure is illustrated in FIG. 7. The use of self-aligned process steps for forming the gates 1 and 2 reduces the parasitic capacitances in the TFT structure, so permitting fast circuit operation. The operating frequency of the TFT circuit may be up to about twice as fast due to the self-alignment. Capacitive coupling between the gates 1 and 2, source 3 and drain 4 are reduced in this structure so permitting a reduction in voltage shifts (voltage offsets) during the operation of the TFT circuit.

Many modifications and variants are possible within the scope of the present invention. Two such variations are illustrated in the intermediate device structure of FIG. 8. In this case, the opaque areas 3 and 4 of the source and drain are formed on the substrate 10 before depositing the semiconductor film to provide the channel region 11. The areas 3 and 4 may each comprise a doped silicon region 3a and 4a respectively on metal tracks 3b and 4b respectively (for example of aluminium or chromium). The semiconductor film may be of amorphous silicon and is transparent to the illumination 31 and 32 used in steps (a) and (g) to selectively expose the photoresist films 26 and 27 respectively. The semiconductor film may be, for example, 20 to 60 nm thick. The second variation in the embodiment of FIG. 8 is that both photoresist films 26 and 27 are of a positive type. Thus, in this case, the photoresist film 27 is provided and selectively exposed before depositing the layer 22. The second gate 2 is formed in this case using a lift off process, by removing the photoresist areas 27a in FIG. 8.

FIG. 9 illustrates a particular TFT structure resulting from this modified embodiment of FIG. 8. In the embodiment of FIG. 9, the second gate 2 is connected to the drain 4 so as to form a field plate in the TFT. The TFT of FIG. 9 thus has a single independently biasable gate 1,G. The provision of such a field plate 2 connected to the drain 4 is particularly advantageous for TFTs operated with high drain bias voltages (for example at least 15 or 20 or even 30 volts). The use of self-aligned process steps for forming the gates 1 and 2 reduces the parasitic capacitances in the TFT structure. Thus, the TFT of FIG. 9 may operate as a high voltage and fast circuit element.

FIG. 10 illustrates a further modification in an embodiment in accordance with the present invention. In this embodiment, the source and drain comprises regions 3a and 4a of a first conductivity type (for example N type) which are formed on the substrate 10 before depositing the semiconductor film 11, and the source and drain also comprise regions 8 and 9 of a second, opposite conductivity type (P type) which are deposited on the semiconductor film 11. The process steps of FIGS. 2 to 7 or FIGS. 8 and 9 are then carried out to form the first and second gates 1 and 2 using the self-aligned photolithographic process steps.

Very fast thin-film circuits can be formed from the TFTs of FIG. 10. The TFT of FIG. 10 has low parasitic capacitances due to the use of the self-aligned photolithographic process steps. Furthermore, the TFT of FIG. 10 may be operated as either a P-channel or N-channel transistor. Thus, very fast circuits with TFTs of complimentary types can be formed with TFT structures of FIG. 10 by appropriately biasing gates 1 and 2 with the same polarity. When the regions 3a and 8 are negatively biased with respect to the regions 4a and 9, the N type region 3a is capable of acting as the source of an N-channel TFT, and the P-type region 9 is capable of acting as the source of a P-channel TFT. In this situation, when the gates 1 and 2 are negatively biased, the N-channel device is suppressed and the TFT of FIG. 10 acts as a P-channel device. However, if gates 1 and 2 are positively biased, then the P-channel TFT is suppressed and the TFT structure of FIG. 10 acts as N-channel device. The gate 1 and 2 close to the source provides the active control gate of the TFT; whereas the other gate 2 or 1 close to the drain may be biased to a constant, higher level of the same polarity so as to act as a field plate which provides field-relief and constant suppression of the opposite-type channel. The provision of both the P-type and N-type regions with electrical connections S(D) and D(S) may also improve the transient behaviour of the TFT by injection of minority carriers to neutralise trapped charge.

From reading the present disclosure, other variations and modifications will be apparent to persons skilled in the art. Such variations and modifications may involve equivalents and other features which are already known in the design, manufacture and use of TFTs and electronic devices comprising such TFTs, and which may be used instead of or in addition to the features already described herein. Although claims have been formulated in this Application, two particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim, or whether or not it mitigates any or all of the same technical problems as does the present invention. The Applicants hereby give notice that new claims may be formulated to such features and/or combinations of such features during prosecution of the present Application or of any further Application derived therefrom.

I claim:

1. A method of manufacturing an electronic device which comprises a thin-film field-effect transistor on a substrate, the transistor having a gate for controlling current flow between source and drain, the gate being formed using self-aligned photolithographic process steps which include:

(a) selectively exposing a first photoresist film by illumination through the substrate while using opaque areas of the source and drain as a photomask, and (b) developing the selectively-exposed first photoresist film to leave a first photoresist area for defining an area of the gate, which method is characterised in that the transistor has first and second gates formed from respective first and second conductive layers in separate self-aligned photolithographic process steps, wherein the first photoresist film of steps (a) and (b) is of positive type and is used in a lift-off process including the steps of:

(c) depositing the first conductive layer of opaque material after developing the first photoresist film in step (b), and (d) then removing the first photoresist area to leave a first area of the first conductive layer where the first and second gates are to be provided, after which a part of the first area of the first conductive layer is removed in a step (e) to leave a smaller, second area of the first conductive layer for forming the first gate, and thereafter a second photoresist film is provided in a step (f), and the second gate is then formed by further self-aligned photolithographic process steps which include:

(g) selectively exposing the second photoresist film by illumination through the substrate while using the opaque areas of the source and drain and first gate as a photomask, and (h) developing the selectively-exposed second photoresist film to leave a second photoresist area for defining an area of the second conductive layer which provides the second gate.

2. A method as claimed in claim 1, further characterised by forming a semiconductor film on the substrate before the opaque areas of the source and drain and before carrying out the steps (a) to (h) for forming the gates, which semiconductor film provides a channel region of the transistor between the source and drain and is transparent to the illumination in steps (a) and (g).

3. A method as claimed in claim 2, further characterised by the source and drain comprising regions of a first conductivity type which are formed on the substrate before depositing the semiconductor film, and by the source and drain comprising regions of a second, opposite conductivity type which are deposited on the semiconductor film.

4. A method as claimed in claim 1, further characterised in that, after forming the opaque areas of the source and drain on the substrate and before carrying out the steps (a) to (h) for forming the gates, a semiconductor film is deposited to provide a channel region of the transistor between the source and drain, the semiconductor film being transparent to the illumination in steps (a) and (g).

5. A method as claimed in claim 4, further characterised by the source and drain comprising regions of a first conductivity type which are formed on the substrate before depositing the semiconductor film, and by the source and drain comprising regions of a second, opposite conductivity type which are deposited on the semiconductor film.

6. A method as claimed in claim 1, further characterised by the second photoresist film of steps (f), (g), and (h) being of negative type, and by the steps of providing an insulating layer on the first gate and then depositing the second conductive layer of transparent material before step (f), and using the second photoresist area as an etchant mask while etching away the second conductive layer from over the source and drain and first gate.

7. A method as claimed in claim 6, further characterised by forming a semiconductor film on the substrate before the opaque areas of the source and drain and before carrying out the steps (a) to (h) for forming the gates, which semiconductor film provides a channel region of the transistor between the source and drain and is transparent to the illumination in steps (a) and (g).

8. A method as claimed in claim 7, further characterised by the source and drain comprising regions of a first conductivity type which are formed on the substrate before depositing the semiconductor film, and by the source and drain comprising regions of a second, opposite conductivity type which are deposited on the semiconductor film.

9. A method as claimed in claim 6, further characterised in that, after forming the opaque areas of the source and drain on the substrate and before carrying out the steps (a) to (h) for forming the gates, a semiconductor film is deposited to provide a channel region of the transistor between the source and drain, the semiconductor film being transparent to the illumination in steps (a) and (g).

10. A method as claimed in claim 3, further characterised by the source and drain comprising regions of a first conductivity type which are formed on the substrate before depositing the semiconductor film, and by the source and drain comprising regions of a second, opposite conductivity type which are deposited on the semiconductor film.

11. A method as claimed in claim 1, further characterised by the second photoresist film of steps (f), (g), and (h) being of positive type, and by the steps of providing an insulating layer on the first gate before step (f), depositing the second conductive layer after developing the second photoresist film in step (h), and then removing the second photoresist area to leave an area of the second conductive layer for the second gate.

12. A method as claimed in claim 11, further characterised by forming a semiconductor film on the substrate before the opaque areas of the source and drain and before carrying out the steps (a) to (h) for forming the gates, which semiconductor film provides a channel region of the transistor between the source and drain and is transparent to the illumination in steps (a) and (g).

13. A method as claimed in claim 12, further characterised by the source and drain comprising regions of a first conductivity type which are formed on the substrate before depositing the semiconductor film, and by the source and drain comprising regions of a second, opposite conductivity type which are deposited on the semiconductor film.

14. A method as claimed in claim 11, further characterised in that, after forming the opaque areas of the source and drain on the substrate and before carrying out the steps (a) to (h) for forming the gates, a semiconductor film is deposited to provide a channel region of the transistor between the source and drain, the semiconductor film being transparent to the illumination in steps (a) and (g).

15. A method as claimed in claim 14, further characterised by the source and drain comprising regions of a first conductivity type which are formed on the substrate before depositing the semiconductor film, and by the source and drain comprising regions of a second, opposite conductivity type which are deposited on the semiconductor film.

16. A method as claimed in claim 1, further characterised in that one of the first and second gates is connected to the drain so as to form a field plate.

* * * * *